US 6,747,308 B2

(12) United States Patent
Mitros et al.

(10) Patent No.: US 6,747,308 B2
(45) Date of Patent: Jun. 8, 2004

(54) SINGLE POLY EEPROM WITH REDUCED AREA

(75) Inventors: Jozef C. Mitros, Richardson, TX (US); Lily Springer, Dallas, TX (US); Roland Bucksch, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/334,319

(22) Filed: Dec. 30, 2002

(65) Prior Publication Data
US 2003/0137005 A1 Jul. 24, 2003

Related U.S. Application Data
(60) Provisional application No. 60/343,632, filed on Dec. 28, 2001.

(51) Int. Cl.[7] .............................................. H01L 29/788
(52) U.S. Cl. .................. 257/315; 257/239; 257/261; 257/314; 257/316; 438/201; 438/211; 438/257; 438/266
(58) Field of Search ................................ 257/239, 261, 257/295, 298, 314–326; 438/3, 201, 211, 257, 260–266, 216, 241, 258, 591–594

(56) References Cited

U.S. PATENT DOCUMENTS

| 4,649,520 A | * | 3/1987 | Eitan ........................... 365/185 |
| 4,807,003 A | * | 2/1989 | Mohammadi et al. ...... 365/187 |
| 4,924,278 A | * | 5/1990 | Logie ........................... 257/318 |
| 4,935,790 A | * | 6/1990 | Cappelletti et al. ......... 257/318 |
| 5,282,161 A | * | 1/1994 | Villa ........................... 365/185 |
| 5,885,871 A | * | 3/1999 | Chan et al. ................. 438/265 |
| 6,235,588 B1 | * | 5/2001 | Laurens ...................... 438/264 |
| 2002/0038882 A1 | * | 4/2002 | Hratmann et al. .......... 257/314 |
| 2002/0089011 A1 | * | 7/2002 | Mirabel ...................... 257/315 |

* cited by examiner

Primary Examiner—David Nelms
Assistant Examiner—Andy Huynh
(74) Attorney, Agent, or Firm—Peter K. McLarty; W. James Brady, III; Frederick J. Telecky, Jr.

(57) ABSTRACT

An EEPROM (100) comprises a source region (122), a drain region (120); and a polysilicon layer (110). The polysilicon layer (110) comprises a floating gate comprising at least one polysilicon finger (112A–112E) operatively coupling the source region (122) and drain region (120) and a control gate comprising at least one of the polysilicon fingers (112A–112E) capacitively coupled to the floating gate. The EEPROM (100) has a substantially reduce area compared to prior art EEPROM since an n-well region is eliminated.

14 Claims, 2 Drawing Sheets

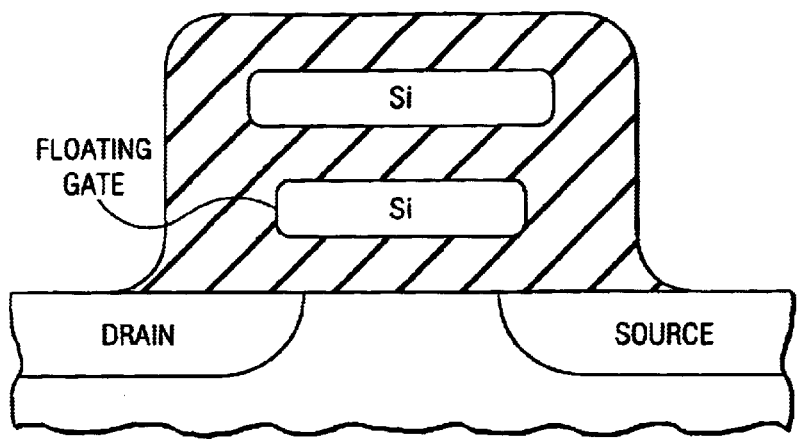
FIG. 1 *(PRIOR ART)*
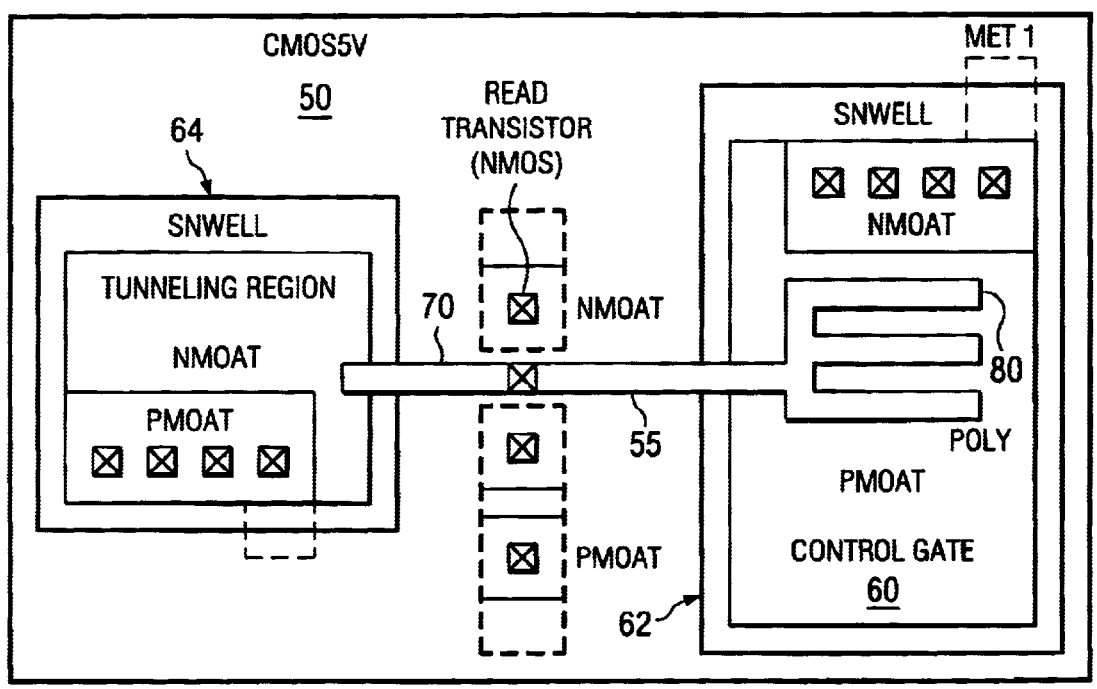
FIG. 2A *(PRIOR ART)*
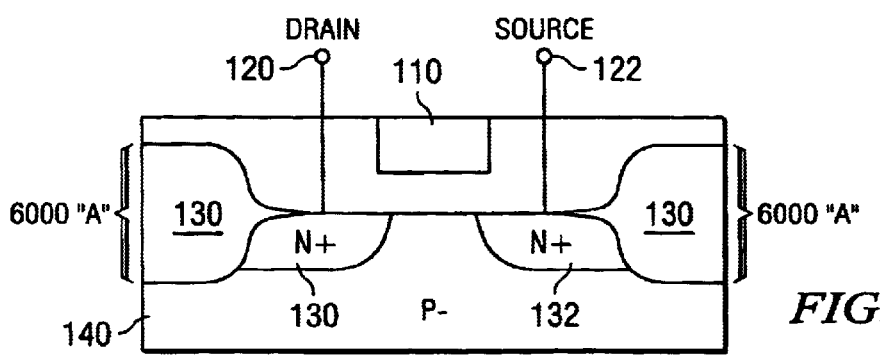
FIG. 3B

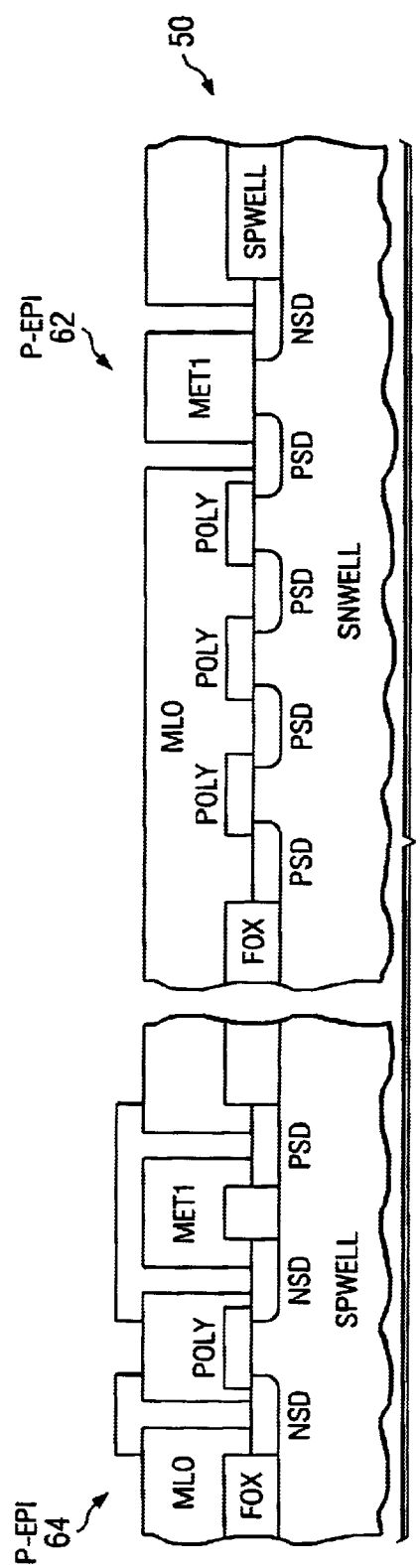
FIG. 2B (PRIOR ART)
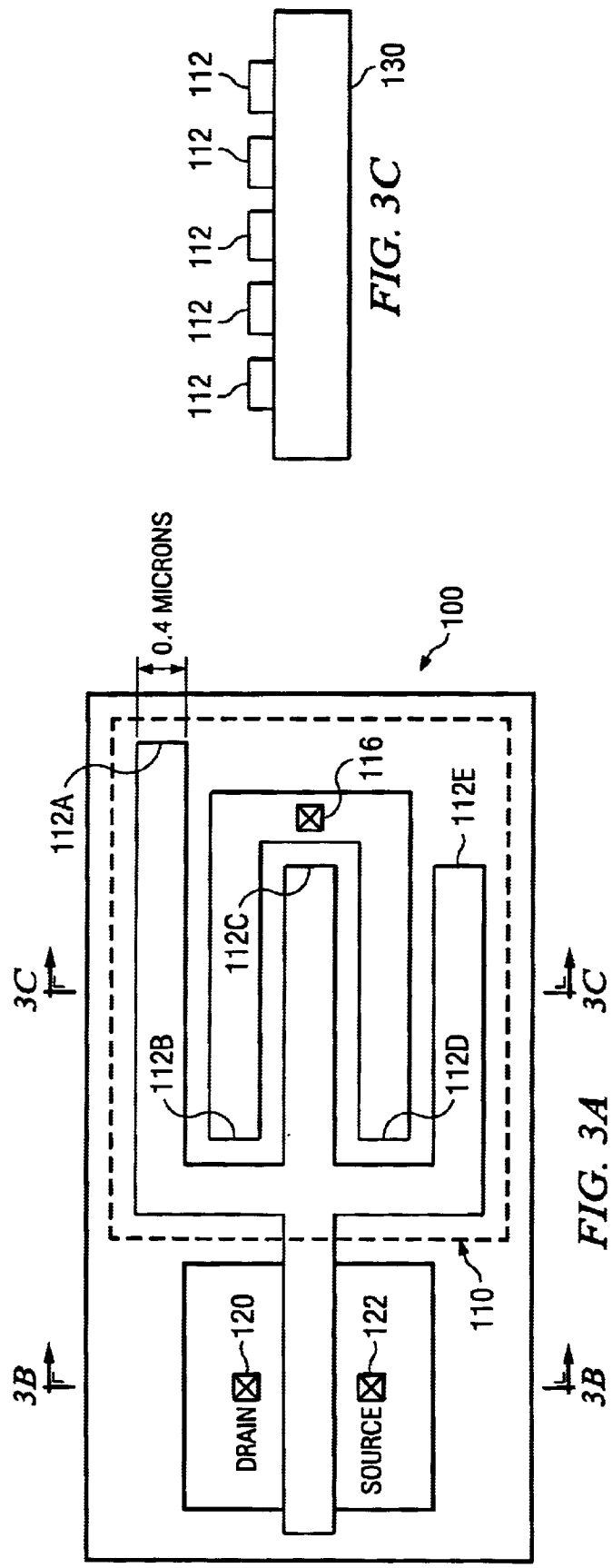
FIG. 3A
FIG. 3C

SINGLE POLY EEPROM WITH REDUCED AREA

PRIORITY DATE

This application claims the benefit of U.S. Provisional Application No. 60/343,632, field Dec. 28, 2001.

TECHNICAL FIELD

The invention relates to improved EEPROM devices and methods of making same and, more particularly, the invention relates to an EEPROM with reduced area. Still more particularly, the present invention relates to a reduced area EEPROM device with dielectric coupling capacitance between poly lines.

BACKGROUND OF THE INVENTION

An Electrically Erasable Programmable Read Only Memory (EEPROM) is a memory cell capable of storing a bit of information, which can be programmed and erased, enabling the EEPROM cell to be reused. EEPROMs are commonly used in either single cells or an array of memory cells, such as flash EEPROMs, which can be erased all at once. Erasure is accomplished by application of an electrical field.

EEPROM memory cells use floating gate transistor technology. A floating gate transistor has a source region and a drain region operably connected with a floating gate. A floating gate is a gate designed to receive an electrical charge making use of a quantum physics effect known as tunneling. The presence or absence of an electrical charge at the floating gate determines the bit value (1 or zero) of the EEPROM memory cell. An EEPROM with a charge above a predetermined threshold represents a "1," which represents an erased cell. A programmed EEPROM bit or a "0" is represented by an empty cell having no significant charge.

Programming, or writing data to an EEPROM, involves applying a specified programming voltage for a specified length of time. Reading the EEPROM cell involves applying a particular voltage and using cell sensor circuitry to detect current movement from the drain to the source via the floating gate. In order to erase the EEPROM cell, the charge stored on the floating gate must be returned to the substrate of the device. This erasure process is accomplished by the application of an electric field sufficient to drive the extra floating gate electrons back to the substrate.

Several problems arise in the art associated with erasure of EEPROMs. One type of EEPROM known in the art is the double-poly EEPROM. As shown in FIG. 1, the prior art double-poly EEPROM has two polysilicon layers. A floating gate layer is separated from a control gate layer by a high quality dielectric material, such as an oxide material. The control gate is used for causing electrons to be pushed through the thin oxide layer separating the control gate from the floating gate so that a cell sensor can read the EEPROM memory cell. The application of a higher voltage charge at the control gate erases the cell by raising the turn flow above a specified threshold. Problems with double-poly EEPROM cells arise from the structure which requires application of two separate polysilicon layers and an intervening oxide layer. In semiconductor manufacturing, the number of layers is directly related to the cost of manufacturing. Additional layers require additional manufacturing steps, and additional manufacturing steps, in turn, mean increased cycle time and increased potential for defects, leading to lower yields.

Attempts to address the above-mentioned and other problems in manufacturing EEPROM devices include the use of a single polysilicon layer EEPROM device. Such efforts provide an n-well as a control gate and erase region. However, high voltages required for programming an erasure require that the n-well portion of the device be relatively large. This makes the overall single-poly EEPROM cells large by semiconductor standards. For example, sizes can range from 200 $um^2$ to 500 um2 per cell which limits their application to designs requiring only a few tens of cells per die.

EEPROM technology would be significantly benefitted by EEPROM cells manufactured with the advantages of using a single polysilicon layer if the overall area of the EEPROM cell structure could be reduced. Such improvements would lead to significant advantages including, but not limited to, reductions in costs, cycle times, defects and the capability to include more memory cells within a given area on a die.

SUMMARY OF THE INVENTION

The present invention provides a decreased area EEPROM device with a single polysilicon layer. The invention also provides a method of making a reduced area EEPROM device.

According to one embodiment, discloses is an Electrically Erasable Programmable Read Only Memory (EEPROM) device. The device comprises a source region, a drain region and a polysilicon layer. The polysilicon layer further comprises a floating gate comprising at least one polysilicon finger operatively coupling the source region and drain region and a control gate comprising at least one polysilicon finger capacitively coupled to the floating gate.

According to another embodiment, an EEPROM device comprising a source region, a drain region and a polysilicon layer is disclosed. The polysilicon layer further comprises a floating gate comprising at least one polysilicon finger operatively coupling the source region and drain region and a control gate comprising at least one polysilicon finger capacitively coupled to the floating gate. A field oxide layer underlying the polysilicon layer.

Further disclosed is a method of making an EEPROM device. The method comprises the steps of forming a source region and a drain region and forming a floating gate operatively coupling the source region with the drain region. Next, a control gate is capacitively coupled to the floating gate wherein the floating gate and control gate are configured to provide capacitance sufficient for controlling the floating gate for writing and erasing the device.

A technical advantages provided by the invention is a decrease in EEPROM cell area compared to prior art EEPROM devices using an n-well control gate.

Another advantage of the invention is reduced die cost as a result of the reduced device area.

BRIEF DESCRIPTION OF THE DRAWINGS

For a better understanding of the invention including its features, advantages and specific embodiments, reference is made to the following detailed description along with accompanying drawings in which:

FIG. 1 illustrates a prior art transistor EEPROM device with two polysilicon layers;

FIG. 2 shows a prior art polyfinger structure utilizing an n-well control gate; and FIGS. 3A–3B show an EEPROM device with single polysilicon layer and five polyfingers according to one embodiment of the invention.

References in the detailed description correspond to like references in the figures unless otherwise noted.

DETAILED DESCRIPTION OF PREFERRED EMBODIMENTS

With reference to the figures and in particular FIG. 2, there is shown a prior art EEPROM, denoted generally as 50. EEPROM 50 includes a small structure known as a floating gate poly 55 which has been in use throughout industry. EEPROM includes a control gate 60, which is used in combination with a diffused n-well regions 62, and with another diffused n-well region 64 on the other side of the floating gate poly 55. N-well region 64 serves as an erasure region. In this case, to program the EEPROM 50 a polymer programming system can be used wherein a high positive voltage is applied to this control gate 60 such that the floating gate poly 55 has positive potential. As a result, the EEPROM 50 attracts electrons from silicon and those electrons are injected into floating gate poly 55 which is charged negatively. In this way, the cell comprising the EEPROM 50 is programed.

To erase the EEPROM 50, a negative voltage cannot be applied because this is an n-type region over p-type region creating an NP diode. Therefore, a positive bias is applied to ensure current is not conducted from one side to another side of the EEPROM 55. Otherwise, it would conduct current that doesn't allow to increase to a higher voltage. Therefore, a second floating gate poly 70 is used which increases the total surface area of the EEPROM 50. In this way, a positive voltage can be applied to the control gate 60 such that electrons flow from the floating gate poly 55.

Thus, to program or erase a prior art EEPROM device, such as EEPROM 50, a control gate 60 couples to a floating gate poly 55. Such EEPROM devices use at least 2 n+regions, source region and drain region, and the device can be programmed or erased by applying appropriate voltages to control gate, source region, and drain region. Thus, in order to have the ability to erase EEPROM 50, the region 64 has to be present in addition to region 62. This results in EEPROM 50 being quite large due to the need to separate the two regions 62 and 64 (which are coupled by the floating gate polys 55 and 70). Such structures are on the order of 200 to 500 square microns making them impractical for use in application where smaller sizes are required. Another disadvantage is the overall cost associated with the manufacture of prior art EEPROMS since more material implies greater cost.

Referring now to FIGS. 3A–3B, therein is shown a reduced area EEPROM device according to one embodiment of the invention. Reduced area EEPROM device, denoted generally as 100, is shown having a single polysilicon layer 110 having five (5) poly fingers 112A–112E. In essence, EEPROM 100 uses capacitive coupling, but this time between two fingers (112A–112E) of polysilicon layer 110, which are spaced each one from another according to design rules for a particular manufacturing process. FIG. 3A shows the use of 0.4 micron process. Therefore, usual spacing of poly-to-poly will result in 0.4 microns or an approximate 0.4 micron poly-to-poly minimum. By using multiple fingers 112A–112E, a capacitor is formed between the two poly fingers that is large enough to allow sufficient control of the potential applied to the control gate 116 of the EEPROM device 100. In this way, a separate region is not required and the EEPROM device 100 can be implemented using an overall smaller region.

Of course, it should be understood the EEPROM device 100 could be manufactured using other processes like a 0.8 microns process, for example. Regardless of the process, the use of multiple polyfingers 112A–112E creates capacitance sufficient to define potential differences thereby allowing a reduction of the total area since no control region is required by the device. For example, looking along line 3B—3B, which defines a cross section of the drain region 120 and the source region 122, a field oxide 130 of usual thickness is found, in this example, 6000 Angstroms although it could also be 4000 or 8000, as well as other values known in the arts. A floating gate 110 and diffused regions, 130 and 132, are shown which could be N+ P+. Also, a P– substrate 140 is provided.

FIG. 3C is a cross section through 3C–3C of the EEPROM 100 through polyfingers 112A–112E showing the field oxide 130 and fingers 112 which comprise the floating gates and control gates of the EEPROM 100. As shown, EEPROM 100 includes 4 floating gates although more or less fingers can be used depending on the application. For example, depending on the surrounding circuitry, it could be more convenient to use only two control fingers and one of floating gate. Other configurations are also possible. The construction of such a structure can be achieved using normal CMOS processes. This is a major benefit of this approach since no process modification is required.

For programming purpose, 16 volts can be applied to the finger used as the control gate, for example. If so, drain voltage could be 5 volts, and the remaining source and back gates would be grounded. These voltages could be applied for about 100 microseconds. Likewise, to erase a voltage could be applied to the control gate such as, for example, minus 16 volts, and drain voltage is zero, and back gate is also zero. This is an example only, because also it depends on a gate oxide thickness and in this case(for example, a gate oxide thickness of 90 Angstroms).

Therefore, the present invention provides an EEPROM device having a significantly reduced area compared to prior art EEPROM devices since only a single n-well region is required as sufficient potential can be built up between the poly lines (as represented by polyfingers 112A–112E) of the structure. As such, the present invention provides a single polysilicon layer Electrically Erasable Programable Read Only Memory (EEPROM) device comprising: a source region, a drain region, and a polysilicon layer. The polysilicon layer further comprises a floating gate comprising at least one polysilicon finger operatively coupling the source region and drain region and a control gate comprising at least one polysilicon finger capacitively coupled to the floating gate.

According to various embodiments, the following features are incorporated into the EEPROM of the present invention: the floating gate polysilicon fingers can be substantially parallel to the one or more control gate polysilicon fingers; a field oxide layer may be underlying the polysilicon layer. The polysilicon layer may consist of material greater than about 75 Angstroms in thickness; the polysilicon layer may consist of material about 90 Angstroms in thickness; the EEPROM may further comprises a plurality of electrically connected floating gate fingers and a plurality of electrically connected control gate fingers capacitively coupled to the floating gate fingers.

According to other embodiments, the EEPROM device of the present invention further comprises a floating gate finger a plurality of electrically connected control gate fingers capacitively coupled to the floating gate finger. Also, the EEPROM device can further comprise a plurality of electrically connected floating gate fingers and a control gate finger capacitively coupled to the floating gate fingers.

According to still another embodiment, the EEPROM device further comprises a field oxide layer underlying the polysilicon layer.

The embodiments shown and described above are only exemplary. Even though numerous characteristics and advantages of the present invention have been set forth in the foregoing description together with details of the method and device of the invention, the disclosure is illustrative only and changes may be made within the principles of the invention to the full extent indicated by the broad general meaning of the terms used in the attached claims.

What is claimed is:

1. A single polysilicon layer Electrically Erasable Programmable Read Only Memory CEEPROM) device comprising:
    a source region;
    a drain region; and
    a polysilicon layer further comprising:
        a floating gate comprising at least one polysilicon finger operatively coupling the source region and drain region; and
        a control gate comprising at least one polysilicon finger capacitively coupled to the floating gate.

2. The EEPROM device according to claim 1 wherein the one or more floating gate polysilicon fingers are substantially parallel to the one or more control gate polysilicon fingers.

3. The EEPROM device according to claim 1 further comprising a field oxide layer underlying the polysilicon layer.

4. The EEPROM device according to claim 1 wherein the polysilicon layer consists of material greater than about 75 Angstroms in thickness.

5. The EEPROM device according to claim 1 wherein the polysilicon layer consists of material about 90 Angstroms in thickness.

6. The EEPROM device according to claim 1 further comprising:
    a plurality of electrically connected floating gate fingers; and
    a plurality of electrically connected control gate fingers capacitively coupled to the floating gate fingers.

7. The EEPROM device according to claim 1 further comprising:
    a floating gate finger; and
    a plurality of electrically connected control gate fingers capacitively coupled to the floating gate finger.

8. The EEPROM device according to claim 1 further comprising:
    a plurality of electrically connected floating gate fingers; and
    a control gate finger capacitively coupled to the floating gate fingers.

9. An Electrically Erasable Programmable Read Only Memory (EEPROM) device comprising:
    a source region;
    a drain region;
    a polysilicon layer further comprising:
        a floating gate comprising at least one polysilicon finger operatively coupling the source region and drain region;
        a control gate comprising at least one polysilicon finger capacitively coupled to the floating gate wherein the control gate and floating gate fingers are substantially parallel to one another; and
    a field oxide layer underlying the polysilicon layer.

10. The EEPROM device according to claim 9 further comprising:
    a plurality of electrically connected floating gate fingers; and
    a plurality of electrically connected control gate fingers capacitively coupled to the floating gate fingers.

11. The EEPROM device according to claim 9 further comprising:
    a floating gate finger; and
    a plurality of electrically connected control gate fingers capacitively coupled to the floating gate finger.

12. The EEPROM device according to claim 9 further comprising:
    a plurality of electrically connected floating gate fingers; and
    a control gate finger capacitively coupled to the floating gate fingers.

13. The EEPROM device according to claim 9 wherein the polysilicon layer consists of material greater than about 75 Angstroms in thickness.

14. The EEPROM device according to claim 9 wherein the polysilicon layer consists of material about 90 Angstroms in thickness.

* * * * *